United States Patent [19]

Tanaka et al.

[11] Patent Number: 4,492,029
[45] Date of Patent: Jan. 8, 1985

[54] INCLINOMETER

[75] Inventors: Osamu Tanaka, Kawasaki; Noboru Watanabe, Tokyo; Hiroshi Iiyama, Yokosuka, all of Japan

[73] Assignee: Jeco Company Limited, Kawasaki, Japan

[21] Appl. No.: 490,666

[22] Filed: May 2, 1983

[30] Foreign Application Priority Data

May 6, 1982 [JP] Japan ............................. 57-65978[U]
Jun. 9, 1982 [JP] Japan ............................. 57-85631[U]

[51] Int. Cl.³ ............................................. G01C 9/06
[52] U.S. Cl. ...................................... 33/366; 33/391
[58] Field of Search ....................... 33/366, 391, 308

[56] References Cited

U.S. PATENT DOCUMENTS 4,277,895 7/1981 Wiklund ................................. 33/366

FOREIGN PATENT DOCUMENTS 1548558 4/1970 Fed. Rep. of Germany ........ 33/391
1590708 5/1978 United Kingdom .................. 33/366

Primary Examiner—Willis Little
Attorney, Agent, or Firm—Posnack, Roberts, Cohen & Spiecens

[57] ABSTRACT

An inclinometer comprising a sector weight pivotally supported on a main body which may become inclined, the weight being relatively rotatable with respect to the main body and constantly hanging vertically due to gravity regardless of an inclination of the main body. A code part is provided on the weight, corresponding to a plurality of bits based on a predetermined code according to a relative rotary angle of the weight with respect to the main body, and a detecting part which becomes inclined together with the main body and becomes displaced with respect to the weight along each of the bits of the code part, produces a detection output based on the predetermined code according to the inclination angle of the main body.

10 Claims, 7 Drawing Figures

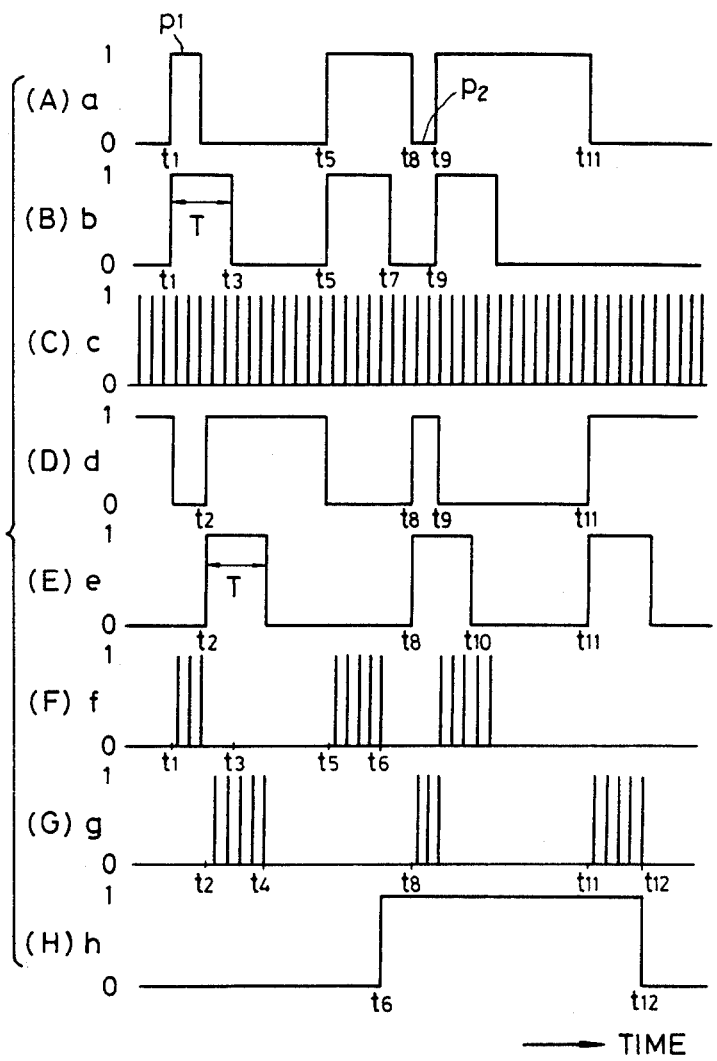

INCLINOMETER

BACKGROUND OF THE INVENTION

The present invention generally relates to inclinometers, and more particularly to an inclinometer suited for use in vehicles, comprising a sensor provided in a main inclinometer body which reads and detects relative displacement of a sector weight according to a Gray code provided on the weight so as to detect any inclination of the main inclinometer body.

In a conventional inclinometer, a weight constantly hangs vertically regardless of the inclination of a main inclinometer body. Such a conventional inclinometer was provided with an indicator dial which rotates according to the inclination of the weight with respect to the main inclinometer body. However, if this conventional inclinometer is used to measure the inclination of an automobile with respect to the front and rear thereof, for example, a rotation transmitting mechanism comprising various gears must be used to display the relative rotation of the weight by the indicator dial, because in this case, a relative rotating plane of the weight and a rotating plane of the indicator dial are perpendicular to each other. For this reason, the mechanism of the inclinometer became complex, and this conventional inclinometer was deficient in that it was impossible to downsize the inclinometer. Furthermore, because the display is achieved by the rotary indicator dial, the result obtained by detecting the inclination could not be obtained as an electrical signal, and there was a disadvantage in that it was impossible to obtain digital display of the inclination.

SUMMARY OF THE INVENTION

Accordingly, it is a general object of the present invention to provide a novel and useful inclinometer in which the above described disadvantages have been overcome.

Another and more specific object of the present invention is to provide an inclinometer in which a Gray code is provided on a sector weight and a sensor is provided in a main inclinometer body, so that any inclination of the main body is detected by the sensor based on the Gray code according to a relative inclination of the weight with respect to the sensor. According to the inclinometer of the present invention, there is no need to provide a rotation transmitting mechanism which was required in the conventional inclinometer. The inclinometer of the present invention utilizes a simple electric circuit and enables downsizing of the inclinometer, and provides accurate detection of the inclination. In addition, according to the inclinometer of the present invention, the degree of inclination can be displayed digitally by providing a display device.

Still another object of the present invention is to provide an inclinometer designed so that an inclination detection signal is only produced when the inclination detection signal does not change for a predetermined time interval. According to the inclinometer of the present invention, even if a weight and/or a main inclinometer body is subject to vibration, it is possible to obtain an inclination detection signal which is unaffected by the vibration. For this reason, the inclinometer of the present invention is suited for use in automobiles, and the inclinometer constantly detects the inclination of the automobile accurately, without being affected by vibration, acceleration, deceleration, and the like of the automobile.

Other objects and further features of the present invention will be apparent from the following detailed description when read in conjunction with the accompanying drawings.

BRIEF DESCRIPTION OF THE DRAWINGS

FIGS. 5(A) through 5(H) are graphs respectively showing signal waveforms at each part of the circuit system shown in FIG. 4.

DETAILED DESCRIPTION

Figure 1A:
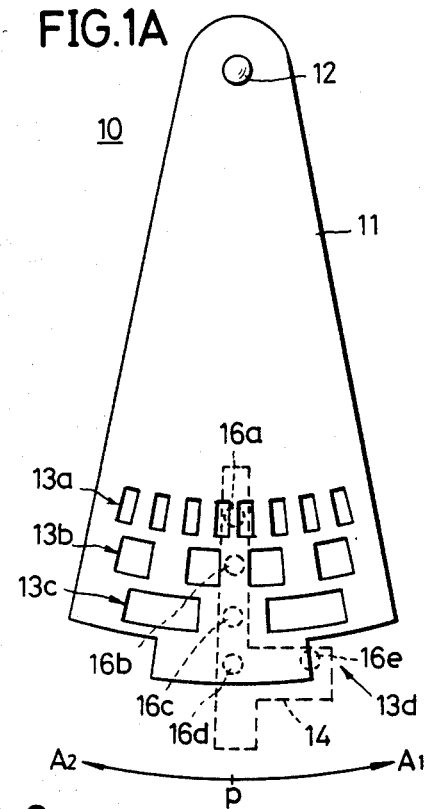
FIGS. 1A and 1B are a front view and a side view, respectively showing an embodiment of a sector weight and a detecting part of an inclinometer according to the present invention.
Figure 1B:
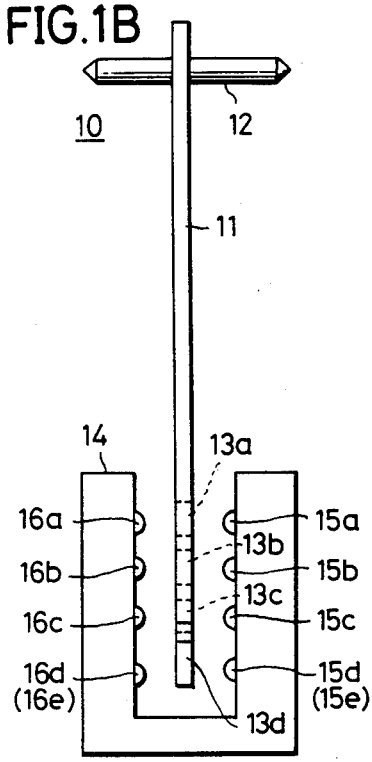

In FIGS. 1A and 1B an inclinometer 10 is mounted in an automobile. The inclinometer 10 comprises a main inclinometer body (not shown) and a sector weight 11 which is freely rotatable on the main inclinometer body by a pin or shaft 12 in the manner of a pendulum. Even when the main inclinometer body becomes inclined together with the inclination of the automobile, for example, the weight 11 hangs by its own weight and gravity in a manner such that a center line thereof constantly coincides with a vertical line. Openings or through hole groups 13a, 13b, and 13c are provided in the weight 11, along arcs of concentric circles about the pin 12. These hole groups 13a, 13b, and 13c are groups of holes which penetrate the weight 11 in a direction along the thickness thereof. In addition, cutouts 13d are formed at the free end of the weight 11 on both right and left sides thereof. When detecting the inclination, these hole groups 13a through 13c and the cutouts 13d act as first four bits of the Gray code along a radial direction about the pin 12. The hole groups 13a through 13c and the cutouts 13d are provided so that values of the first four bits of the Gray code to which they correspond change in terms of a predetermined angle, that is, one degree, for example.

A U-shaped detecting frame 14 of a sensor is provided in the main inclinometer body, and the weight 11 is inserted between walls of the frame 14. Light-emitting elements 15a through 15d and photosensitive elements 16a through 16d are respectively provided on the inner walls of the frame, at positions where the elements may oppose the hole groups 13a through 13c and the cutouts 13d. These light-emitting elements 15a through 15d and photosensitive elements 16a through 16d are respectively arranged in straight imaginary lines passing through the shaft 12. Further, a light-emitting element 15e and a photosensitive element 16e are provided on the inner walls of the frame 14 at positions where these elements 15e and 16e may oppose one of the cutouts 13d, separated from the elements 15d and 16d. In a state where the inclinometer 10 itself is not inclined, the elements 15a through 15c and 16a through 16c respectively oppose parts between the holes and cutouts of the weight 11, that is, at parts other than the hole groups 13a through 13c and the cutouts 13d. In this state, respective halves of the elements 15e and 16e oppose one cutout 13d as shown in FIG. 1A.

As the inclinometer 10 becomes inclined together with the automobile, the center line of the weight 11 constantly coincides with the vertical line due to its own weight, while the frame 14 becomes inclined towards a direction of an arrow A1 or A2 according to the inclining direction of the automobile. In this case, the weight 11 is relatively displaced rotationally with respect to the frame 14.

The photosensitive elements 16a through 16e produce a signal having a level "1" when these elements 16a through 16e receive light which are emitted from the light-emitting elements 15a through 15e and passed through the hole groups 13a through 13c and the cutout 13d, and produce a signal having a level "0" when these elements 16a through 16e do not receive light. Hence, according to the inclination angle of the frame 14, output signals having waveforms shown in FIGS.2(A) through 2(E) are respectively obtained from the photosensitive elements 16a through 16e. In FIGS.2(A) through 2(E), the horizontal axis indicates the inclination angle, the arrows A1 and A2 indicate the inclining directions, and a point P indicates a position where the inclination angle is zero.

Description will now be given with respect to an embodiment of a circuit system of the inclinometer according to the present invention provided with a display device. The output signals of the photosensitive elements 16a through 16e shown in FIGS.2(A) through 2(E) are respectively supplied to detection stabilizing circuits 20a through 20e shown in FIG. 3 which will be described hereinafter. Output signals of the detection stabilizing circuits 20a through 20d are respectively supplied to a conversion circuit 21 wherein the 4-bit signal based on the Gray code is converted into a signal according to a binary coded decimal (BCD) system.

The output 4-bit signal of the conversion circuit 21 is supplied to an indicator driving circuit 22. The indicator driving circuit 22 decodes the BCD code of the 4-bit signal supplied thereto, and produces a 2-digit decimal signal. This output 2-digit decimal signal of the indicator driving circuit 22 is supplied to an indicator device 23 as an indicator driving signal. For example, the indicator device 23 is constituted by two digits of 7-segment light-emitting diodes (LEDs), and carries out digital display of the inclination angle with a 2-digit decimal number according to the indicator driving signal supplied thereto. The signal obtained from the conversion circuit 21 and decoded by the indicator driving circuit 22, is a signal with a code which varies in terms of 1° according to the inclination angle of the frame 14. The indicator driving circuit 22 produces the same signal when the inclination angle of the weight 11 with respect to the center point P is within 0.5° in either direction. Hence, if the inclination is within a range of ±0.5°, the indicator device 23 is driven to display 0°. On the other hand, if the inclination in one direction is within a range of 0.5° to 1.5°, the indicator device 23 is driven to display 1°, and similarly display 2° if the inclination in one direction is within a range of 1.5° to 2.5°, and so on. The indicator device 23 is similarly driven to display such angles with respect to the inclination in the other direction. Accordingly, if the frame 14 becomes inclined by an angle in the range of 3.5° to 4.5°, for example, the bits of the input signal to the conversion circuit 21 assume the values "0, 1, 1, 0", and a value "4" is displayed on the indicator device 23. In order to reduce the electric power consumption, the indicator device 23 comprising the 2-digit indicator is designed to display "0" instead of "00" when displaying zero.

On the other hand, the 4-bit output signal of the conversion circuit 21 is supplied to an OR-circuit 24. An output signal of the OR-circuit 24 is applied to one input terminal of an AND-gate 25 and one input terminal of an AND-gate 27. The output of the detection stabilizing circuit 20e is supplied to the other input terminal of the AND-gate 25, and to the other input terminal of the AND-gate 26 through an inverter 26.

Figure 2:
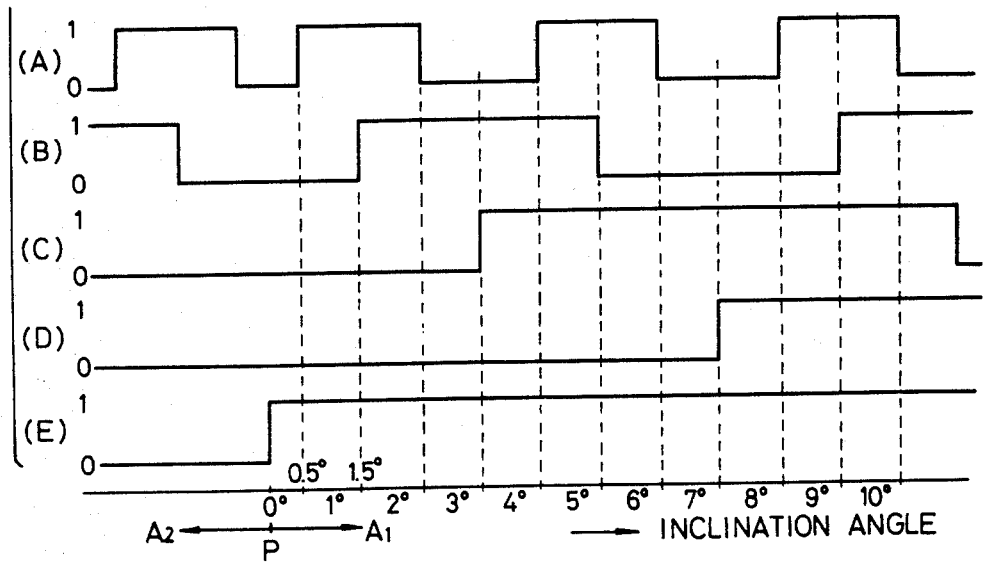
FIGS. 2(A) through 2(E) are graphs respectively showing output waveforms of a sensor shown in FIGS. 1A and 1B.
Figure 3:
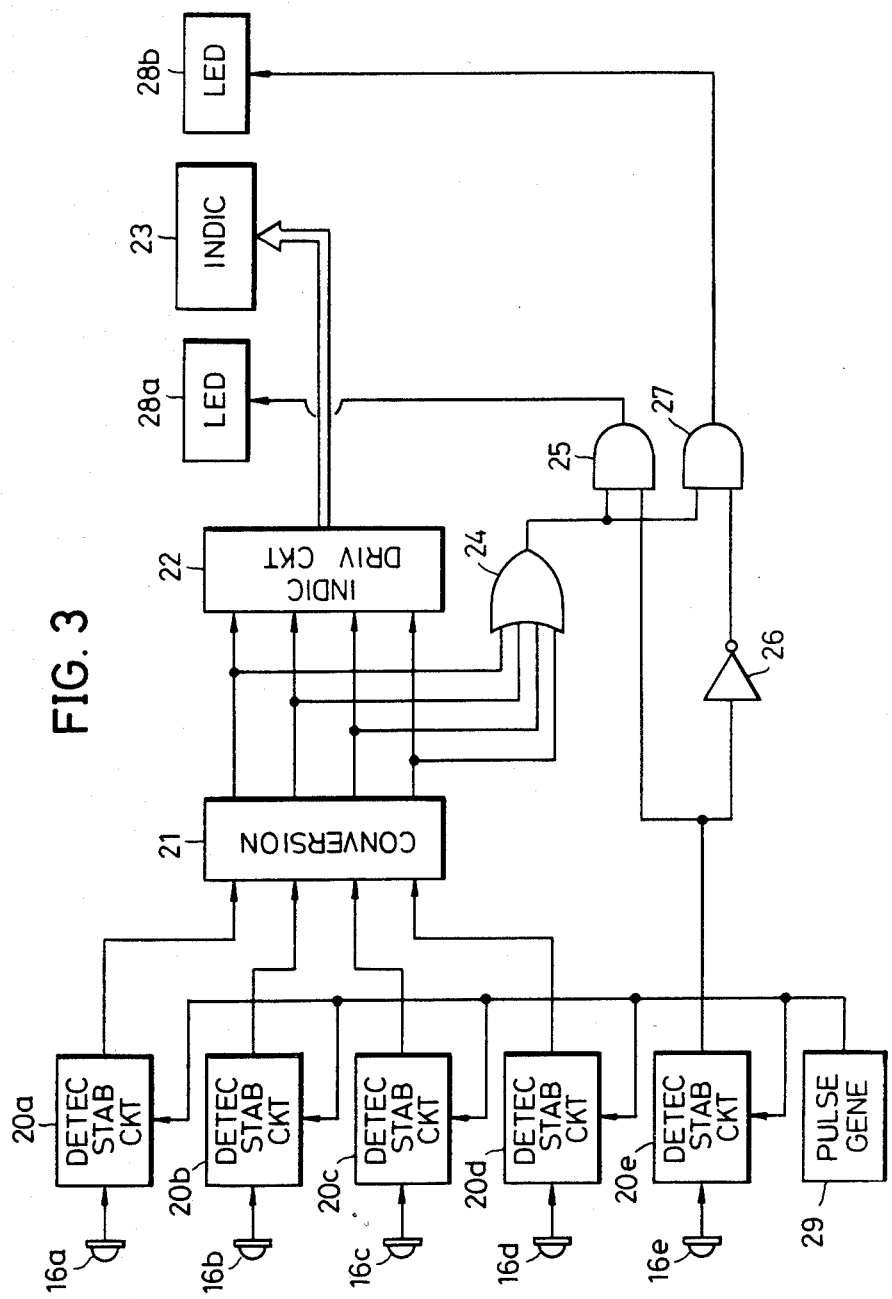
FIG. 3 is a systematic block diagram showing an embodiment of a circuit system of an inclinometer according to the present invention.

If the frame 14 becomes inclined towards the direction A1 from the center point P by an angle greater than 0.5°, for example, the output level of the photosensitive element 16e becomes "1" as shown in FIG. 2(E), and the output level of the AND-gate 25 also becomes "1". Thus, a light-emitting diode (LED) 28a which indicates the inclination towards the direction A1 is turned ON and emits light. In this state, because the output of the photosensitive element 16e is inverted by the inverter 26 and then applied to the AND-gate 27, the output level of the AND-gate 25 is "0" and an LED 28b remains OFF. On the other hand, if the frame 14 becomes inclined towards the direction A2 from the center point P by an angle greater than 0.5°, the output level of the photosensitive element 16e becomes "0", the output level of the AND-gate 25 becomes "0", and the output level of the AND-gate 27 becomes "1". Hence, in this case, the LED 28b is turned ON and emits light, to indicate inclination towards the direction A2.

When the inclinometer 10 is used to display the inclination with respect to the front and rear of the automobile, the inclinometer 10 is arranged so that the inclining directions A1 and A2 of the frame 14 coincide with the inclining directions with respect to the front and rear of the automobile. Moreover, the LEDs 28a and 28b respectively display "front" and "rear" or "up" and "down" to indicate the inclination. In addition, when the inclinometer 10 is used to display the inclination of the automobile with respect to right and left directions thereof, the inclinometer 10 is arranged so that the inclining directions A1 and A2 of the frame 14 coincide with the right and left directions of the automobile. In this case, the LEDs 28a and 28b respectively display "right" and "left" to indicate the inclination.

There are cases where one of the outputs of the photosensitive elements 16a through 16e repeatedly assumes the level "1" and "0", as the frame 14 swings back and forth due to vibrations caused by the bumpy road on which the automobile travels, vibrations caused by the acceleration and deceleration of the automobile, and the like. In such cases, the display made by the indicator device 23 and the LEDs 28a and 28b undergo frequent changes, and become irritating to the driver and passenger of the automobile. Hence, in order to prevent the above output from undergoing frequent level changes between the levels "1" and "0" due to external disturbances, such as vibrations from being supplied to the conversion circuit 21, and the AND-gates 25 and 27, the detection stabilizing circuits 20a through 20e which will be described hereinafter are provided for eliminating the external disturbances and stabilizing the detection output.

Figure 4:
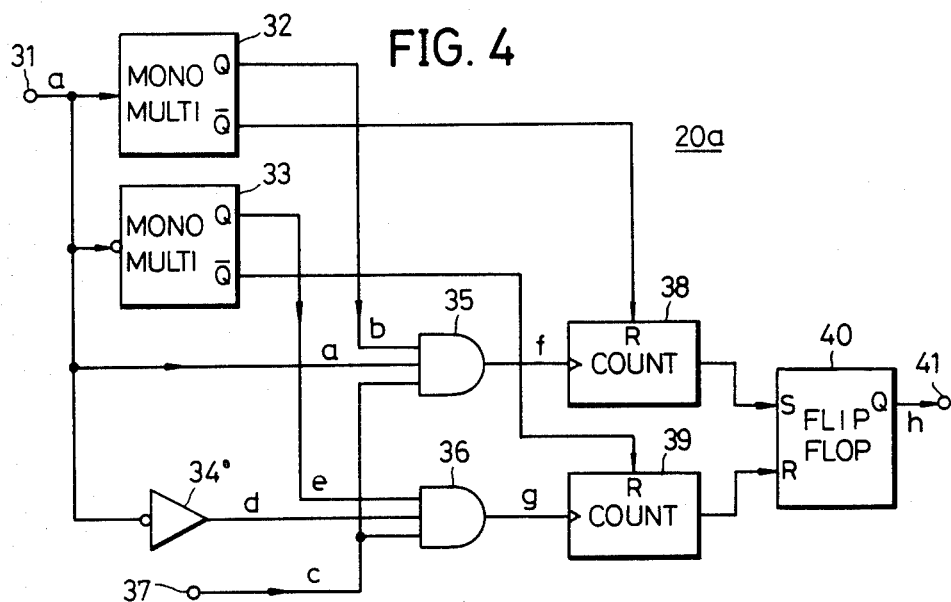
FIG. 4 is a systematic circuit diagram showing an embodiment of a detailed circuit of blocks constituting a part of the block system shown in FIG. 3.

The detection stabilizing circuits 20a through 20e respectively have the same construction. Thus, only the detection stabilizing circuit 20a, for example, is shown in FIG. 4, and the illustration and description of the detection stabilizing circuits 20b through 20e will be omitted. A single pulse generator 29 is provided with respect to the detection stabilizing circuits 20a through 20e, and the detection stabilizing circuits 20a through 20e respectively receive the pulse generated by this pulse generator 29.

In FIG. 4, an output signal a of the photosensitive element 16a shown in FIG. 5(A), is applied to an input terminal 31. In FIGS. 5(A) through 5(H), the horizontal axis corresponds to the time base. When the photosensitive element 16a is at a position opposite a part of the weight 11, in the vicinity of a boundary between the hole of the hole group 13a and the part where the hole of the hole group 13a is not provided, unwanted detection output components are likely to be introduced due to external disturbances such as vibration of the frame 14. A part P1 corresponding to a short time interval of the level "1" within a part where the level is "0" in FIG. 5(A), and a part P2 corresponding to a short time interval of the level "0" within a part where the level is "1" in FIG. 5(A), are such unwanted detection output disturbance components.

The signal a is supplied to monostable multivibrators 32 and 33, through the input terminal 31. The input terminal of the monostable multivibrator 33 is an inverting input terminal. The monostable multivibrator 32 is triggered by a rise in the signal a supplied thereto, and produces a signal b through its Q-output terminal. This signal b assumes the level "1" during a time interval T as shown in FIG. 5(B), and this signal b is supplied to an AND-gate 35. A signal having an inverted waveform of the signal b, is produced through a $\overline{Q}$-output terminal of the monostable multivibrator 32, and supplied to a reset terminal R of a counter 38. The monostable multivibrator 33 is triggered by a rise in a signal obtained by inverting the signal a, that is, triggered by a fall in the signal a, and produces a signal e through its Q-output terminal. This signal e assumes the level "1" during the time interval T as shown in FIG. 5(E), and this signal e is supplied to an AND-gate 36. A signal having an inverted waveform of the signal e, is produced through a $\overline{Q}$-output terminal of the monostable multivibrator 33, and supplied to a reset terminal R of a counter 39. The time interval T of the signals b and e is selected to a time interval longer than time intervals of the unwanted detection output components P1 and P2 which are introduced due to the vibrations and the like, that is, 0.5 second, for example.

In addition, the signal a obtained through the input terminal 31 is supplied to the AND-gate 35. Further, the signal a is inverted by an inverter 34, and then supplied to the AND-gate 36 as a signal d shown in FIG. 5(D). A pulse c shown in FIG. 5(C) which is generated by the pulse generator 29 is applied to a terminal 37, and supplied to the AND-gates 35 and 36. The pulse c is generated from the pulse generator 29 with a time interval such that five pulses exist within the above time interval T.

The AND-gate 35 passes the pulse c during an interval in which the levels of both the signals a and b are "1". An output pulse f shown in FIG. 5(F) thus produced from the AND-gate 35, is applied to a counter input terminal of the counter 38. The counters 38 and 39 respectively count the number of pulses applied thereto through the respective counter input terminals, after a signal is applied to the respective reset terminals R thereof. These counters 38 and 39 respectively produce one pulse when their counted values become equal to "5". Accordingly, the counter 38 counts the pulse f after a time t1 which corresponds to the point in time when the signals a and b rise. However, because the number of pulses obtained through the AND-gate 35 in correspondence with the unwanted detection output component P1 of the signal a is three, for example, and does not produce an output. The counter 38 is reset by the $\overline{Q}$-output of the monostable multivibrator 32, at a time t3 which corresponds to the point in time when the signal b falls. Thereafter, the counter 38 counts five pulses f supplied thereto within the time interval T after a time t5 which corresponds to the point in time when the signals a and b rise. The counter 38 produces an output when the five pulses f are counted at a time t6, and supplies this output to a set terminal S of a reset-and-set (R-S) flip-flop 40 to set this flip-flop 40.

The counter 38 counts the pulse f in correspondence with the unwanted detection output component P1 in the above described manner, however, the counted value assumes a value less than "5". Accordingly, the counter 38 does not produce an output pulse, and as a result, the flip-flop 40 does not become set. Therefore, there is no effect of the unwanted detection output component P1, and this unwanted detection output component P1 is substantially eliminated.

The counter 38 is reset at a time t7, after the counter 38 produces an output pulse. Thereafter, due to the existence of the unwanted detection output component P2, the counter 38 is supplied with five pulses f after a time t9 and counts these pulses f, and applies an output pulse to the set terminal of the flip-flop 40. However, as will be described hereinafter, the flip-flop 40 is not reset at this time, and continues to assume the set state set at the time t6.

On the other hand, the AND-gate 36 passes the pulse c during an interval in which the levels of both the signals d and e are "1". An output signal g shown in FIG. 5(G) thus produced from the AND-gate 36, is applied to a counter input terminal of the counter 39. The counter 39 counts the pulse g supplied thereto within the time interval T after a time t2 which corresponds to a point in time when both the signals d and e rise. The counter 39 produces an output pulse at a point in time when five pulses g are counted, and supplies this output pulse to a reset terminal R of the flip-flop 40. However, because the flip-flop 40 is already in a reset state, the flip-flop 40 does not change its state.

Thereafter, the counter 39 counts the pulse g after a time t8 which corresponds to the point in time when the signals d and e rise, however, the number of pulses supplied thereto through the AND-gate 36 between the times t8 and t9 corresponding to the unwanted detection output component P2 is three. Thus, the counter 39 does not produce an output, and is reset by the $\overline{Q}$-output of the monostable multivibrator 33 at a time t10 corresponding to a fall in the signal e. Then, the counter 39 counts five pulses g supplied thereto within the time interval T after a time t11 corresponding to the rise in the signals d and e and corresponding to the fall in the signal a. The counter 39 produces an output pulse at a time t12 when these five pulses g are counted, and supplies this output pulse to the reset terminal R of the flip-flop 40 to reset the flip-flop 40.

Accordingly, the flip-flop 40 is set by the pulse signal supplied to its set terminal S from the counter 38 at the time t6, and thereafter reset by the pulse signal supplied to its reset terminal R from the counter 39 at the time t12. Hence, a signal h shown in FIG. 5(H) is obtained through a Q-output terminal of the flip-flop 40, and this signal h is supplied to the conversion circuit 21 shown in FIG. 3 through an output terminal 41. In the case where the circuit shown in FIG. 4 is the detection stabilizing circuit 20e, the output signal h obtained through the output terminal 41 is supplied to the AND-gate 25 and the inverter 26.

Thus, the detection output signal h between the times t6 and t12, which is unaffected by the unwanted detection output components P1 and P2 and stable, can be obtained from the detection stabilizing circuit 20a (or one of the circuits 20b through 20e) according to the output between the times t5 and t11 of the signal a which is to be detected originally. Accordingly, the display does not undergo frequent change to cause irritation to the driver and passenger even due to vibrations and the like of the automobile. That is, it is possible to stably display only the inclination angle which is to be detected and displayed originally.

Figure 6:
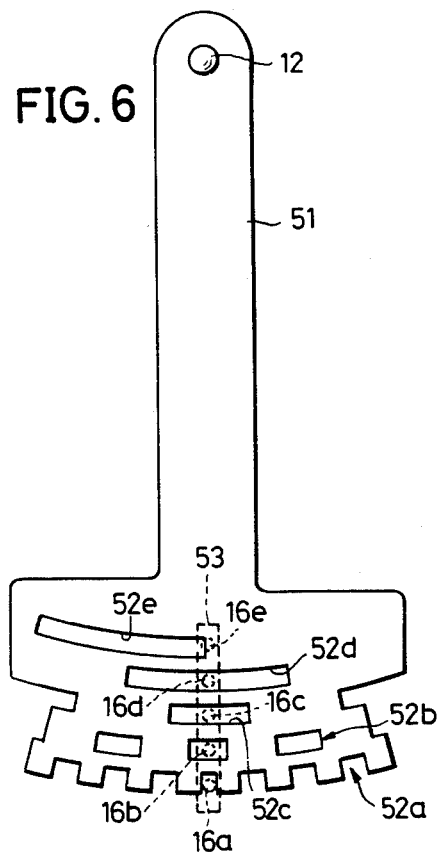
FIG. 6 is a front view showing another embodiment of a weight and a sensor used in an inclinometer according to the present invention.

Another embodiment of the weight and detecting part shown in FIGS.1A and 1B, is shown in FIG. 6. In FIG. 6, those parts which are the same as those corresponding parts in FIGS.1A and 1B are designated by the same reference numerals. A weight 51 is relatively provided freely rotatable on the main inclinometer body (not shown) by the pin 12. Rectangular cutouts 52a are provided along an arc at the lower end edge of the weight 51. Further, an opening or through hole group 52b and through holes 52c through 52e are successively formed at the lower part of the weight 51 along concentric arcs towards an upper part from a lower part thereof. Cutout parts constituting a part of the hole group 52b and the hole 52c, are provided on both sides of the weight 51. The cutouts 52a, the hole group 52b, and the holes 52c and 52d respectively act as the first through fourth bits of the Gray code. The hole 52e is a hole provided for detecting the inclining direction. Light-emitting elements (not shown) and photosensitive elements 16a through 16e are respectively provided along a straight line on a frame 53, at positions opposing the cutouts 52a, the hole group 52b, and the holes 52c through 52e. The operations of the present embodiment may be easily understood from the description given before in conjunction with FIGS.1A and 1B, and description thereof will be omitted.

In the embodiments described heretofore, the detection by the detecting part is carried out according to the cooperation of the through holes or cutouts provided in the weight. However, light reflecting parts or light absorbing parts may be provided on the weight based on the Gray code. Moreover, the detection is not limited to optical detection using light-emitting elements and photosensitive elements, and the detection may be carried out magnetically, for example.

Further, the present invention is not limited to these embodiments, but various variations and modifications may be made without departing from the scope of the present invention.

What is claimed is:

1. An inclinometer comprising:
   a weight pivotally supported on a main body which may become inclined, said weight being of a sectoral shape and being relatively rotatable with respect to said main body and constantly hanging vertically due to gravity regardless of an inclination of said main body;
   a code part provided on said weight, said code part consisting of a plurality of sequences of code elements which correspond to a plurality of bits based on a Gray code according to a relative rotary angle of said weight with respect to said main body; and
   a detecting part which becomes inclined together with said main body and becomes displaced with respect to said weight along each of said sequences of said code elements, for producing a detection output based on the Gray code according to the inclination angle of said main body.

2. An inclinometer as claimed in claim 1 which further comprises display signal forming means supplied with the detection output of said detecting part, for foming a display signal, and display means supplied with the display signal from said display signal forming means, for displaying the inclination angle of said main body.

3. An inclinometer as claimed in claim 2 in which said code part further comprises a bit of a code for indicating an inclining direction, said detecting part produces a detection output due to the bit of the code for indicating the inclining direction, said display signal forming means is supplied with the detection output of said detecting part and produces a display signal indicating the inclination angle and the inclining direction, and said display means is supplied with said display signal and displays the inclination angle and the inclining direction.

4. An inclinometer as claimed in claim 1 in which said code part comprises an opening or through hole group corresponding to said plurality of bits provided in said weight with an arrangement based on the Gray code, said detecting part comprises a light-emitting element group and a photosensitive element group provided at positions opposing said through hole group with said weight inserted between said light-emitting element and photosensitive element groups, and said photosensitive element group produces said detection output.

5. An inclinometer as claimed in claim 4 in which said code part further comprises cutout parts formed at edge parts of said weight, according to said Gray code.

6. An inclinometer as claimed in claim 2 in which said display signal forming means comprises a conversion circuit supplied with the detection output of said detecting part, for converting the detection output into a binary coded decimal code, and a display driving circuit supplied with an output signal of said conversion circuit, for obtaining a display driving signal and supplying said display driving signal to said display driving circuit.

7. An inclinometer as claimed in claim 1 comprising means for displaying said detection output as the inclination angle of said main body with respect to the vertical.

8. An inclinometer comprising:
   a weight pivotally supported on a main body which may become inclined, said weight being relatively rotatable with respect to said main body and constantly hanging vertically due to gravity regardless of an inclination of said main body;
   a code part provided on said weight, said code part corresponding to a plurality of bits based on a predetermined code according to a relative rotary angle of said weight with respect to said main body;

a detecting part which becomes inclined together with said main body and becomes displaced with respect to said weight along each of the bits of said code part, for producing a detection output based on said predetermined code according to the inclination angle of said main body; and a detection stabilizing circuit supplied with the detection output of said detecting part, which does not respond to change of the detection output of said detecting part in a time interval shorter than a predetermined time interval, and produces an output in accordance with the original detection output of said detecting part.

9. An inclinometer as claimed in claim 8 in which said detection stabilizing circuit comprises counting pulse generating means for generating counting pluses, counting means for counting the counting pulses from said counting pulse generating means and producing an output when a predetermined number of counting pulses are counted, limiting means for limiting the number of counting pulses supplied to said counting means to a number less than said predetermined number with respect to change in a time interval shorter than said predetermined time interval, and means for producing an output in accordance with the original detection output of said detecting part according to the output of said counting means.

10. An inclinometer as claimed in claim 8 in which said detection stabilizing circuit comprises: counting pulse generating means for generating counting pulses; a first monostable multivibrator supplied with said detection output of said detecting part and triggered by a rise in said detection output, for producing an output Q with a predetermined time interval T and an inverted output $\overline{Q}$; a second monostable multivibrator supplied with said detection output of said detecting part and substantially triggered by a fall in said detection output, for producing an output Q with the predetermined time interval T and an inverted output $\overline{Q}$; a first AND-gate supplied with the output Q of said first monostable multivibrator, said detection output of said detecting part, and the counting pulses from said counting pulse generating means, for passing said counting pulses during an interval in which said output Q of said first monostable multivibrator and said detection output of said detecting part assume a level "1"; a second AND-gate supplied with the output Q of said second monostable multivibrator, a signal obtained by inverting said detection output of said detecting part, and said counting pulses from said counting pulse generating means, for passing said counting pulses during an interval in which said output Q of said second monostable multivibrator and said inverted detection output assume a level "1"; a first counter supplied with an output of said first AND-gate, for counting this output of said first AND-gate, said first counter being reset when supplied with the inverted output $\overline{Q}$ of said first monostable multivibrator; a second counter supplied with an output of said second AND-gate, for counting this output of said second AND-gate, said second counter being reset when supplied with the inverted output $\overline{Q}$ of said second monostable multivibrator; and a flip-flop which is set when supplied with an output of said first counter and reset when supplied with an output of said second counter, for producing an output during an interval between set and reset times thereof, said flip-flop producing an output as the output of said detection stabilizing circuit.

* * * * *